United States Patent [19]

Badger et al.

[11] 3,982,187

[45] Sept. 21, 1976

[54] AFC DEFEAT MECHANISM

[75] Inventors: Joe G. Badger; Alarico A. Valdettaro, both of Bloomington, Ind.

[73] Assignee: Sarkes Tarzian, Inc., Bloomington, Ind.

[22] Filed: Mar. 31, 1975

[21] Appl. No.: 563,316

Related U.S. Application Data

[62] Division of Ser. No. 503,979, Sept. 6, 1974, Pat. No. 3,906,805.

[52] U.S. Cl. .............................................. 325/457
[51] Int. Cl.² .......................................... H04B 1/06
[58] Field of Search ..................... 325/457; 74/569; 200/153 LB, 30 R

[56] References Cited
UNITED STATES PATENTS

| | | | |
|---|---|---|---|
| 2,956,437 | 10/1960 | Opocensky | 200/153 LB |
| 3,466,549 | 9/1969 | Milnes | 325/457 |
| 3,870,961 | 3/1975 | Suzuki | 325/457 |

*Primary Examiner*—Robert L. Griffin
*Assistant Examiner*—Robert Hearn
*Attorney, Agent, or Firm*—Mason, Kolehmainen, Rathburn & Wyss

[57] ABSTRACT

A mechanism for driving a television tuner channel indicator located behind a panel and mounted concentrically with a selector shaft and a concentric fine tuning shaft. The driving mechanism includes a two-piece gear housing mounted on the selector shaft for rotation therewith, a driving gear affixed to the fine tuning shaft, a driven gear, and three planetary gears mounted within the housing and engaging the driving and driven gears. The selector shaft passes through the gear housing and engages the coarse tuning mechanism of the tuner. The driven gear engages the fine tuning mechanism of the tuner, and the indicator is attached to the gear housing. The driving mechanism may be provided with apparatus for actuating an AFC defeat switch when the television tuner is being fine tuned or tuned between channels.

6 Claims, 10 Drawing Figures

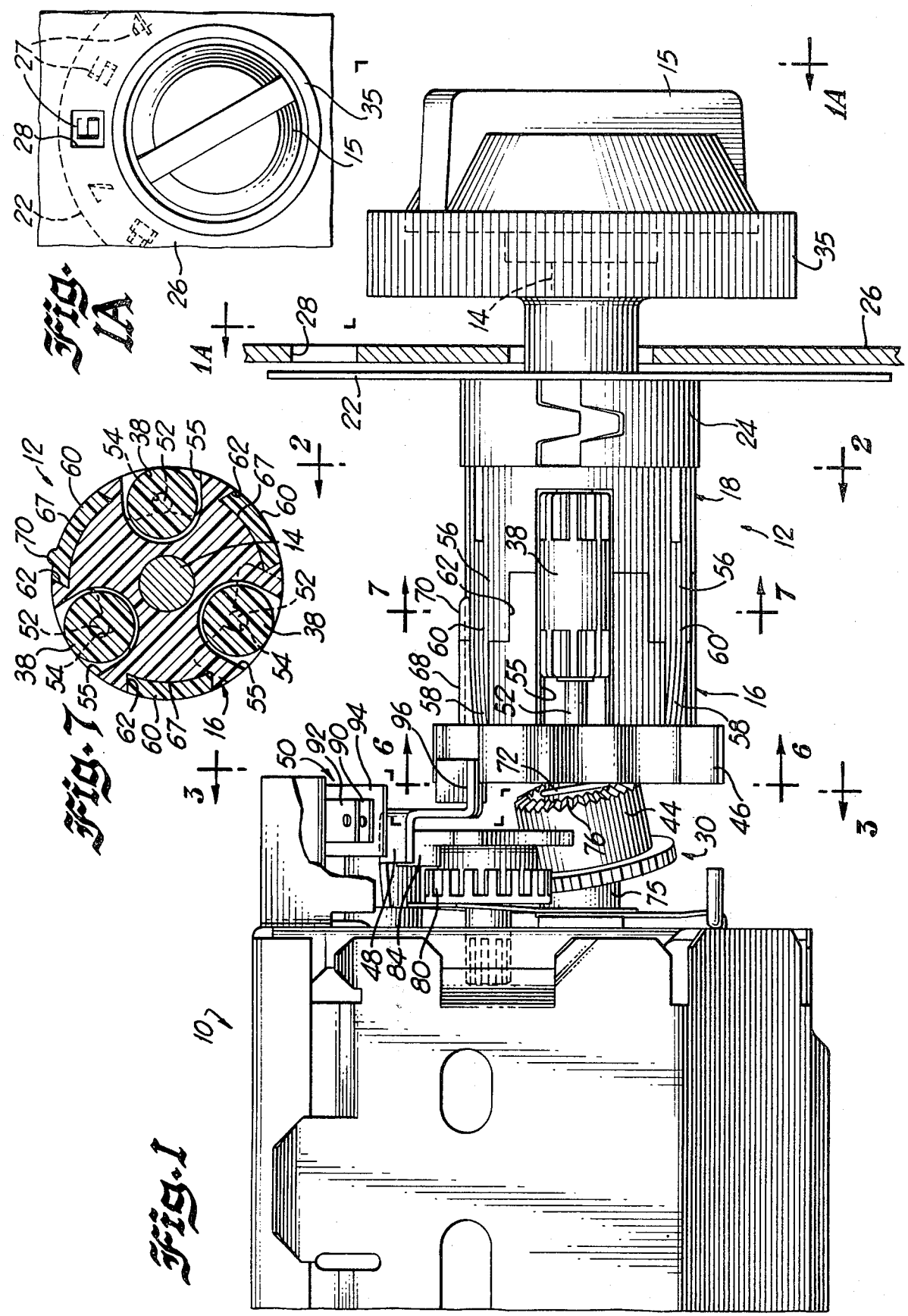

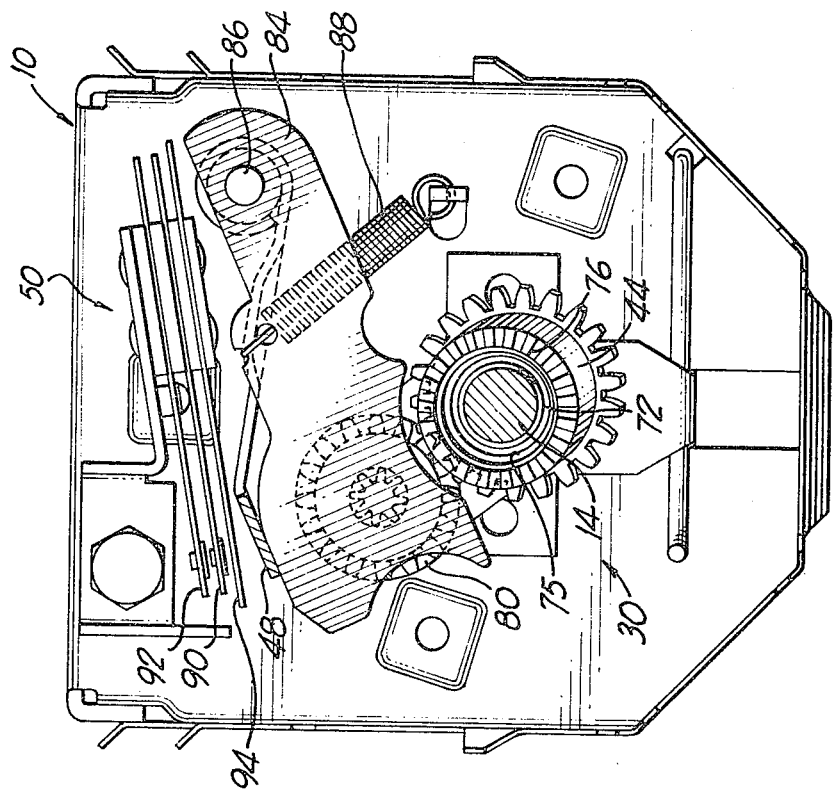
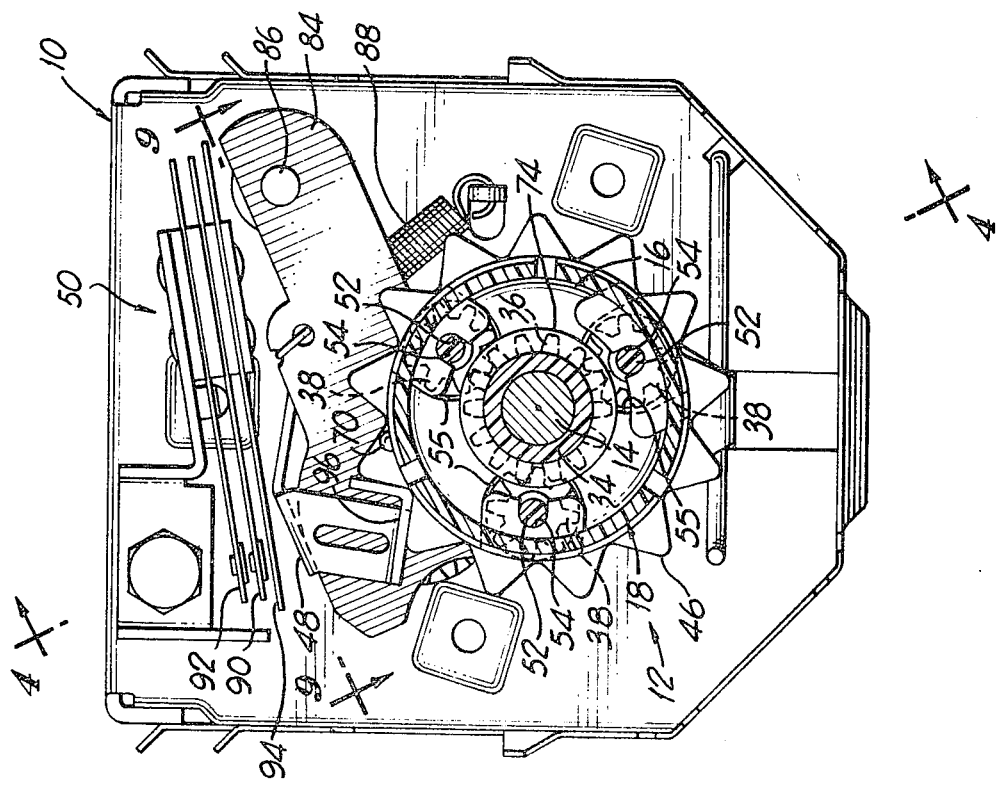

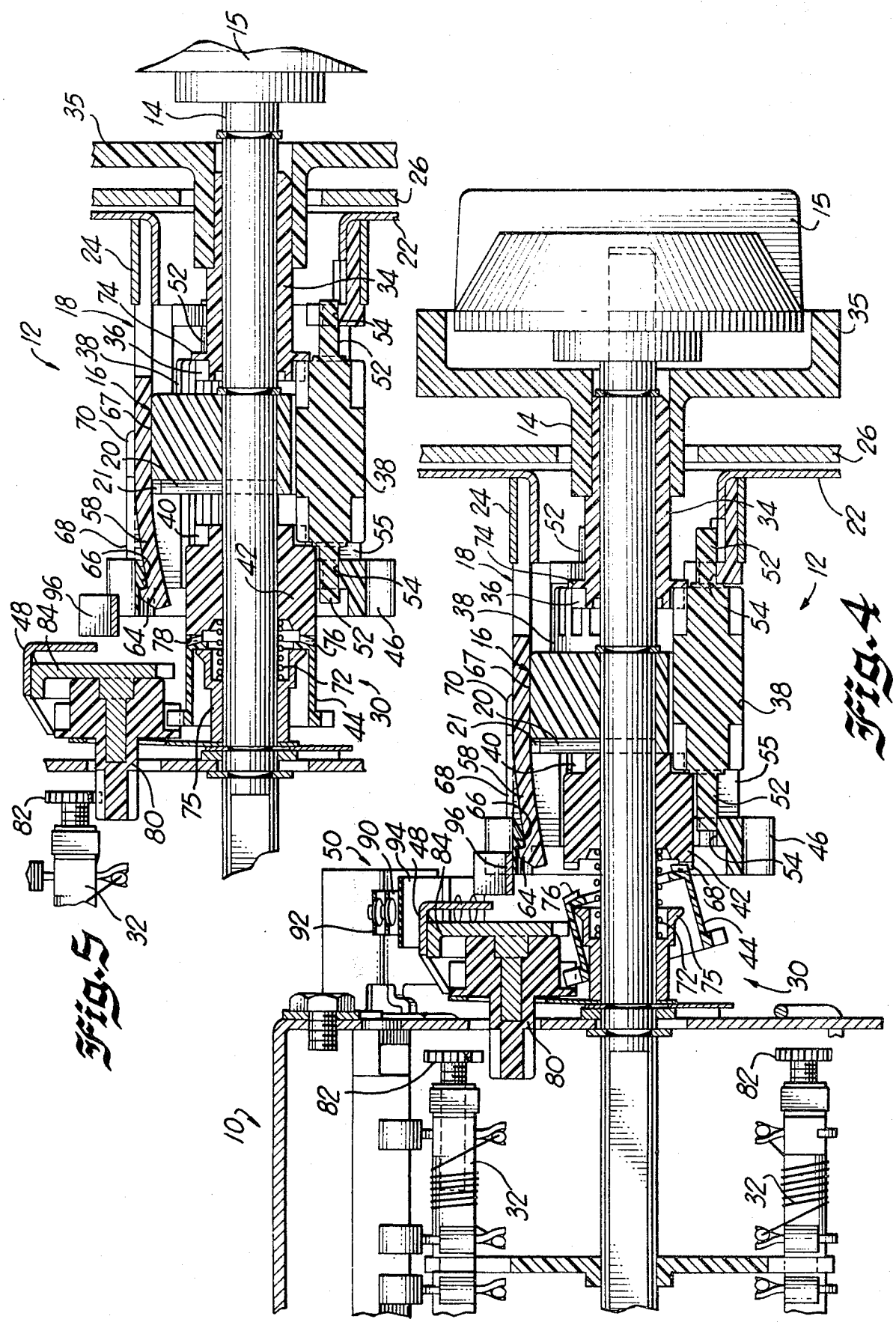

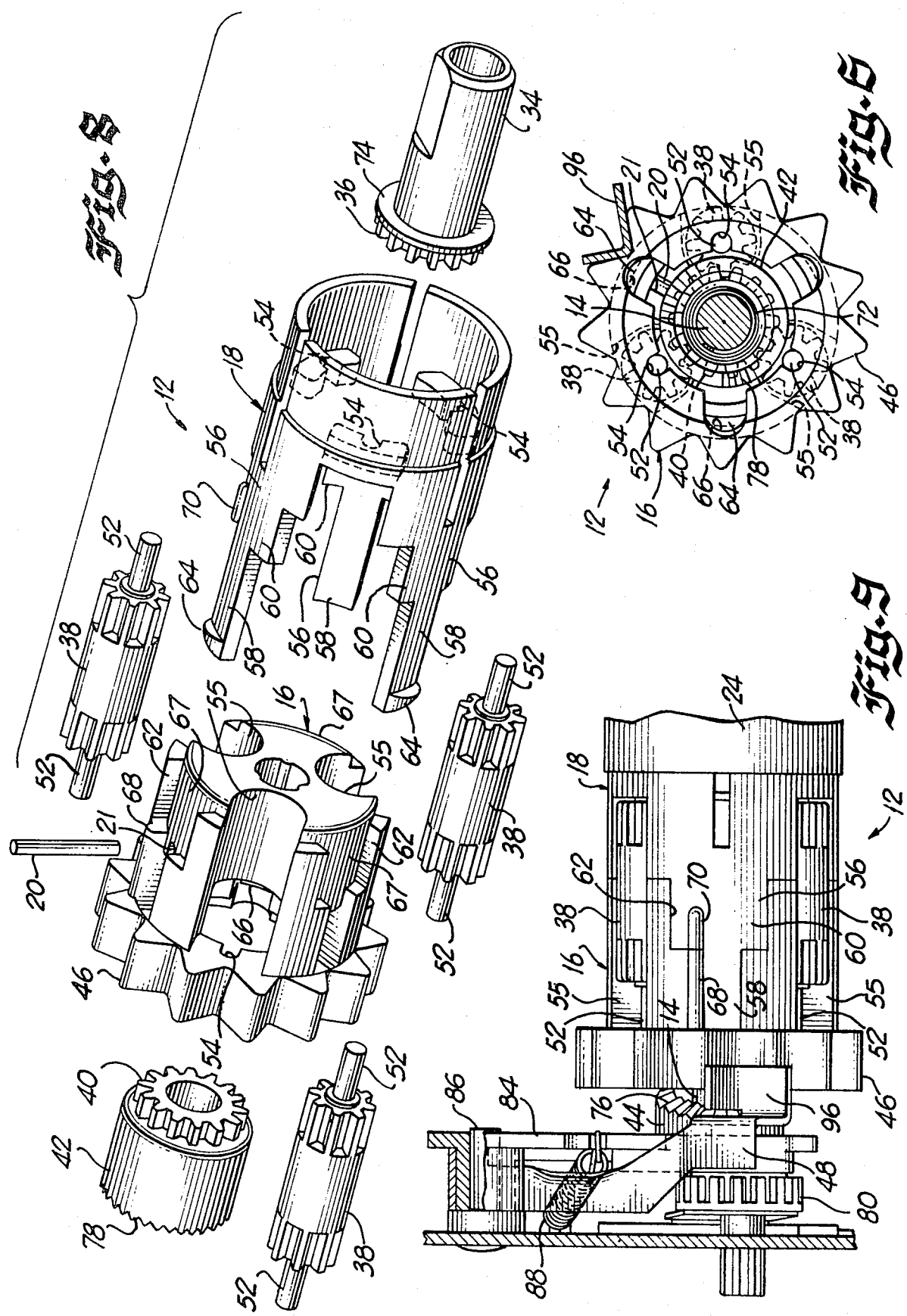

AFC DEFEAT MECHANISM

This is a divisional application of copending patent application Ser. No. 503,979, filed on Sept. 6, 1974, now U.S. Pat. No. 3,906,805.

BACKGROUND OF THE INVENTION

This invention relates generally to tuning systems, and more particularly to driving internally mounted channel indicators for detented type tuning systems.

Present day television tuners generally employ a detented selector shaft for selecting the television channel to be viewed. A hollow fine tuning shaft is generally mounted concentrically with the selector shaft. A selector knob is attached to the selector shaft, and a fine tuning knob is attached to the fine tuning shaft.

A channel indicator for indicating the number assigned to the television channel being received is usually provided. For reasons of simplicity, such as indicator is generally attached to or mounted behind the selector knob outside the television set housing. Such indicators have the advantage of relative simplicity, however, due to the limited size of the selector and fine tuning knobs, the channel numbers may be difficult to read or illuminate. As a result, it has become common practice to provide a relatively large indicator inside the television set housing. The numerals on such an indicator may be made much larger than the numerals on an external indicator, and the internal indicator may be readily illuminated, thereby allowing the channel number of the station to which the receiver is tuned to be readily observed from a distance, such as from across the room.

Such internal indicators have always been difficult to drive when a concentric fine tuning system has been employed. This is because the external fine tuning shaft of a concentric fine tuning system covers the internal selector shaft and prevents access to the selector shaft. As a result, prior art systems utilizing an internal indicator have either employed a nonconcentric fine tuning shaft to permit access to the selector shaft, or have extended the selector shaft into the television receiver beyond the length of the fine tuning shaft to permit a gear mechanism to be attached to the protruding end of the selector shaft for driving the indicator.

Neither of the above alternatives has been proven entirely satisfactory. The use of a gear train attached to the end of the selector shaft is not entirely satisfactory because the clearance between meshing gears permits sufficient movement of the indicator with respect to the selector shaft to cause an inaccurate or uncentered display of the channel number. The use of a nonconcentric tuning shaft eliminates the inaccuracies caused by the gear train by allowing the tuning indicator to be connected to the selector shaft directly, but the lack of a concentric fine tuning knob is objectionable to many consumers.

Accordingly, it is an object of the present invention to provide an improved drive mechanism for a television channel indicator.

It is another object of the present invention to provide an improved drive mechanism for a television channel indicator for use with television tuners having a concentric fine tuning shaft.

It is yet another object of the present invention to provide an improved drive mechanism for a channel indicator that displays the number of the channel being received with greater accuracy and at a lower cost than could heretofore be achieved.

In accordance with a preferred embodiment of the invention, a gear mechanism having a driving gear, a driven gear and three planetary gears is provided. The driven gear is attached to the fine tuning shaft and drives the driven gear by means of the three planetary idler gears. The three planetary idler gears are mounted in a housing that is mounted concentrically with the selector shaft and the fine tuning shaft, and attached to the selector shaft for rotation therewith. Because the housing rotates in synchronism with the selector shaft, an indicator may readily be attached to the housing to be driven directly thereby. The use of three planetary idler gears between the driving and driven gears assures smooth operation of the fine tuning shaft and prevents "cogging" effects by providing three equally spaced power transmission paths between the driving and driven gears to assure a uniform application of power to the driven gear.

A star wheel may readily be affixed to the housing for activating a switch such as an AFC defeat switch whenever channels are being changed. The same switch may be coupled to the driven gear in order to defect the AFC during the fine tuning operation.

The invention, both to its organization and method of operation, together with further objects and advantages thereof, will best be understood by reference to the following detailed description, taken in conjunction with the accompanying drawings, in which:

FIG. 1 is an elevational side view of a VHF television tuner employing the indicator driving mechanism according to the present invention;

FIG. 1A is a fragmentary front view of the VHF television tuner taken along line 1A—1A of FIG. 1 showing a front view of the indicator affixed to the driving mechanism;

FIG. 2 is a front sectional view of the indicator driving mechanism taken along the line 2—2 of FIG. 1;

FIG. 3 is a front sectional view taken along line 3—3 of FIG. 1;

FIG. 4 is a side sectional view taken along line 4—4 of FIG. 2 showing the fine tuning mechanism in its disengaged state;

FIG. 5 is a fragmentary side view similar to FIG. 4 showing the fine tuning mechanism in engagement with the VHF television tuner for effecting fine tuning thereof;

FIG. 6 is a sectional view taken along line 6—6 of FIG. 1;

FIG. 7 is a sectional view of the indicator driving mechanism taken along line 7—7 of FIG. 1;

FIG. 8 is an exploded perspective view of the indicator driving mechanism according to the invention; and FIG. 9 is a sectional view taken along line 9—9 of FIG. 2.

DETAILED DESCRIPTION

A. General

Referring now to the figures, with particular reference to FIG. 1, there is shown a VHF television tuner 10 employing the improved driving mechanism 12 according to the invention. The driving mechanism 12 is mounted to a selector shaft 14 (FIGS. 4 and 5) and includes a pair of housing sections 16 and 18, also shown in FIG. 8. A selector knob 15 is attached to the selector shaft 14. A pin 20 is inserted into the selector shaft 14 to prevent the housing section 16 from rotating with respect to the shaft 14. The pin 20 engages a notch 21 in the housing 16 (FIGS. 6 and 8), and the entire housing assembly comprising the housing sections 16 and 18 rotates in synchronism with the rotation of the selector shaft 14. An indicator 22 is affixed to the housing section 18 by means of a resilient retaining ring 24 and rotates with the housing. As a result, the inaccuracies caused by backlash in the gear train normally used to drive the indicator are eliminated. The entire assembly is mounted within the television set behind a panel 26 which has a transparent portion or an opening such as the opening 28 for viewing a portion of the indicator 22.

The indicator 22 is best illustrated in FIG. 1A. The indicator 22 contains a plurality of channel indicating numbers 27, one for each channel to which the tuner 10 may be tuned. The numbers are positioned about the indicator 22 such that one of the numbers is in alignment with the opening 28 for each detent position of the tuner. Because the indicator 22 is rigidly affixed to the driving mechanism 12, which rotates in synchronism with the selector shaft 14, the indicator 22 is advanced incrementally upon rotation of the tuning knob 15 to bring a different one of the indicator numbers into alignment with the opening 28 each time the selector shaft 14 is advanced.

The indicator numbers 27 may be formed as transparent areas on an opaque surface, or as opaque areas on a transparent surface and may be lighted from behind the panel 26 by a light source (not shown) to provide an illuminated indication of the channel number of the station being received.

The driving mechanism 12 also drives a fine tuning mechanism 30 which selectively tunes each one of a plurality of tuning sticks 32 inside the VHF television tuner 10. The fine tuning mechanism 30 is driven by a fine tuning shaft 34 which has a fine tuning knob 35 and a driving gear 36 affixed thereto. The driving gear 36 drives three planetary idler gears 38 which engage the driving gear 36 and a driven gear 40. The three idler gears 38 form three parallel power transmission paths between the driving gear 36 and the driven gear 40 for driving the driven gear in the same direction and at the same speed as the driving gear 36. The use of three parallel power transmission paths eliminates "cogging" effects that occur when a single idler gear is used, and which can result in an uneven application of power to the driven gear.

The driven gear 40 drives an output shaft 42 which in turn drives a flower pot gear 44 forming part of the fine tuning mechanism 30. The operation of the flower pot gear 44 and the tuning mechanism 30 is described in U.S. Pat. No. 3,316,770, incorporated herein by reference, issued to Joe G. Badger and Alarico A. Valdettaro and assigned to the same assignee as the assignee of the present invention.

A star wheel operating as a 13 lobe cam 46 is formed integrally with the housing portion 16. The cam 46 serves to activate a lever 48 which in turn operates an AFC defeat switch 50 (FIG. 2) whenever the selector shaft 14 is rotated between channels. The operation of the AFC defeat switch 50 will be more fully described in a subsequent portion of this specification.

B. Driving Mechanism

Referring to FIG. 8 in conjunction with FIGS. 6 and 7, which show the driving mechanism 12 in greater detail, it can be seen that the three idler gears 38 are equally spaced about the periphery of the housing sections 16 and 18. Each of the idler gears 38 has a relatively small diameter integrally molded elongated shaft 52 extending from opposite ends thereof. The shaft 52 of each of the idler gears 38 is retained within the housing sections 16 and 18 by three U-shaped channels 54 molded into each of the housing sections 16 and 18, and the shafts 52 are retained within the U-shaped channels 54 by three larger oppositely facing U-shaped channels 55 molded in housing section 16. The shafts 52 have a relatively small diameter to minimize the rotational friction between the channels 54 and the shafts 52, and are elongated to permit axial movement of the gears 38 between the housing sections 16 and 18.

The housing section 18 has three elongated stepped retaining members 56 extending therefrom for engaging the housing section 16 (FIGS. 8 and 9). Each of the retaining members 56 has a relatively narrow end portion 58 and a wider central portion 60. Each of the central portions 60 engages a slot 62 in the housing section 16, and each end portion 58 has an integrally molded hook 64 for engaging a similar hook 66 (FIGS. 4 and 5) inside the housing section 16. The housing sections 16 and 18 are fabricated from a resilient plastic or similar material so that the hooks 64 engage the respective hooks 66 with a snap action after being deflected by the hooks 66. The retaining members 56 are supported by the housing section 16 by three islands 67 located between the three U-shaped channels 55. The islands 67 provide support to the junction between each of the central portions 60 and the end portions 58. As a result, all flexing occurs within the end portions 58 (FIGS. 4 and 5), thus providing a greater engaging force between the hooks 64 and 66 than would be obtained if the entire elongated members 56 were allowed to flex.

The widths of the three central portions 60 and the three slots 62 are made unequal (FIG. 7) so that the two housing sections 16 and 18 can be snapped together only when they are oriented with each of the central portions 60 positioned opposite a corresponding slot 62 of equal width. A pair of identifying marks 68 and 70 (FIG. 9) are provided to aid in the orientation of the two housing sections 16 and 18 prior to assembly.

The lengths of the retaining members 56 are calculated to permit axial movement of the gears 38 within the housing formed when the sections 16 and 18 are snapped together (FIG. 1). The axial movement of the three idler gears 38 is necessary to transmit axial force from the fine tuning knob 35 to the fine tuning mechanism 30 when a push to engage type fine tuning mechanism is employed, as will be further explained in a subsequent portion of the specification. However, the drive mechanism is also usable with non-push to engage fine tuning systems, such as, for example, the system described in U. S. Pat. No. 3,183,726 assigned to the same assignee as the assignee of the present invention. If a non-push to engage type fine tuning system is employed, it is not necessary to provide for axial movement of the idler gears 38.

In the embodiment shown in the drawings, a push to engage fine tuning system is employed. In the illustrated system, the output shaft 42 is resiliently biased away from the tuner 10 by a biasing spring 72 (FIGS. 4 and 5). The biasing force exerted by the spring 72 is transmitted as an axial force to the idler gears 38 for causing the gears 38 to slide axially toward the housing section 18. The axial movement of the output shaft 42 and the idler gears 38 creates a gap between the flower pot gear 44 and the output shaft 42, and causes the flower pot gear to tilt as shown in FIG. 4. This tilting action is described in the aforementioned U.S. Pat. No. 3,316,770. In the tilted position, the fine tuning mechanism 30 is not in engagement with any of the tuning sticks 32.

Exerting axial pressure on the tuning knob 35 in a direction toward the tuner 10 causes the fine tuning shaft 34 and the driving gear 36 to slide axially on the selector shaft 14 toward the tuner 10. The driving gear 36 is provided with a radially extending shoulder 74 which engages the idler gears 38 and causes the idler gears 38 to move axially toward the tuner 10 in response to the pressure applied to the fine tuning knob 35. The axial movement of the gears 38 in turn causes the driven gear 40 and the output shaft 42 to slide toward the flower pot gear 44 as shown in FIG. 5. This causes the flower pot gear 44 to pivot about a supporting member 75 until the axis of rotation of the flower pot gear 44 is coaxial with the axes of the selector shaft 14 and the output shaft 42. A circular spline 76 on the flower pot gear 44 engages a similar circular spline at the end of the output shaft 42 to permit the flower pot gear 44 to rotate in response to a rotation of the output gear 42.

As the flower pot gear 44 pivots about its axis it engages a stepped idler gear 80 and forces the gear 80 upward into engagement with a fine tuning adjustment gear 82 on one of the tuning sticks 32. Rotation of the fine tuning knob 35 is now effective to rotate the fine tuning adjusting gear 82.

The fine tuning idler gear 80 is rotatably mounted to a lever 84 that is pivotably mounted to the housing of the tuner 10 (FIGS. 2, 3 and 9). The lever 84 is pivoted about a shaft 86, the shaft 86 providing a common pivot point for the levers 48 and 84 in this embodiment. A biasing spring 88 exerts a downward force on the lever 84 to disengage the idler gear 80 from the adjustment gears 82 and to exert a radial force on the flower pot gear 44 to thereby tilt the gear 44 as shown in FIG. 4. Depressing the fine tuning knob 35 overcomes the force of the spring 88 and allows the lever 84 to pivot sufficiently to permit the flower pot gear 44 to align itself with the output shaft 42 and to bring the idler gear 80 into engagement with one of the adjustment gears 82.

C. AFC Defeat

The levers 48 and 84 also serve to actuate the AFC defeat switch 50. The AFC defeat switch 50 is connected to a conventional automatic frequency control circuit (not shown) inside the tuner 10. The closing of the contacts 90 and 92 of the switch 50 serves to defeat the operation of the automatic frequency control circuit when the tuner is being fine tuned or tuned between stations.

The closing of the contacts 90 and 92 during fine tuning is accomplished in the following manner. When the fine tuning knob 35 is depressed to bring the idler gear 80 into engagement with the fine tuning adjustment gear 82, the lever 84 is pivoted upwardly about the shaft 86. The upward movement of the idler gear 80 causes the lever 84 to move upwardly and to engage the lever 48. The upward movement of the lever 84 causes the lever 48 to move upwardly and to engage a flexible insulating strip 94 forming part of the switch 50. The upward movement of the lever 48 causes the insulating strip 94 to deflect and to exert an upward pressure on the contacts 90 and 92. This closes the contacts 90 and 92 and provides an electrical path therebetween for defeating the automatic frequency control circuit.

The closing of the switch contacts 90 and 92 during the channel changing operation is effected by moving the lever 48 upwardly with the cam 46 while maintaining the lever 84 in a downward position. The lever 84 must be maintained in a downward position to prevent the idler gear 80 from engaging any of the adjustment gears 82 during the channel changing operation. This prevents the undesired rotation of the adjustment gears 82 that would occur should any one of the adjustment gears 82 be engaged by the idler gear 80 while the selector shaft 14 and the turret containing the tuning sticks 32 were being rotated.

Accordingly, the lever 48 is provided with a cam follower 96 for engaging the cam 46. The cam 46 and the cam follower 96 are positioned with respect to each other such that when any one of the thirteen VHF television channels has been selected, the cam follower 96 rests in a valley between two of the thirteen cam lobes of the cam 46 as shown in FIGS. 2 and 6. When the selector knob 15 is rotated, rotation is imparted to the selector shaft 14 and to the housing section 16 of the driving mechanism 12. This causes the cam 46 to rotate and to pivot the lever 48 into engagement with the insulating strip 94 as the cam follower 96 is engaged by one of the cam lobes of the cam 46. The pivoting action of the lever 48 closes the contacts 90 and 92 as the selector shaft 14 is rotated between channels. When a new channel has been selected, the cam follower 96 again rests in a valley between two of the cam lobes of the cam 46, the contacts 90 and 92 are opened, and the automatic fine tuning circuit resumes normal operation.

While there have been illustrated and described various embodiments of the present invention, it will be apparent that various changes and modifications thereof will occur to those skilled in the art. It is intended in the appended claims to cover all such changes and modifications as fall within the true scope and spirit of the present invention.

What is claimed as new and desired to be secured by Letters Patent of the United States is:

1. In a television tuner of the type having a detented selector shaft rotation of which is effective to tune said tuner to one of a plurality of discrete frequencies, a fine tuning mechanism, a fine tuning shaft coupled to said fine tuning mechanism, rotation of said fine tuning shaft being effective to tune said tuner over a predetermined range of frequencies about each of said discrete frequencies, and an automatic frequency control circuit, an automatic frequency control defeat mechanism comprising:

a switch affixed to said television tuner and electrically coupled to said automatic frequency control circuit, operation of said switch being effective to defeat the operation of said automatic frequency control circuit;

cam means affixed to said selector shaft for rotation therewith, said cam means having a predetermined number of lobes equal in number to the number of detent positions of said selector shaft;

a first lever pivotably attached to said tuner for engaging said cam means and said switch, said first lever being operative to operate said switch for defeating the operation of said automatic frequency control circuit upon the rotation of said selector shaft between detent positions thereof; and means operatively coupled to said fine tuning mechanism and said switch for defeating the operation of said automatic frequency control circuit in response to the operation of said fine tuning mechanism, said means for defeating the operation of said automatic frequency control circuit in response to the operation of said fine tuning mechanism including a second lever pivotally attached to said tuner and engageable by a portion of said fine tuning mechanism, a portion of said first lever being interposed between said second lever and said switch.

2. An automatic frequency control defeat mechanism as recited in claim 1 wherein said first and second levers are pivoted about a common point.

3. An automatic frequency control defeat mechanism as recited in claim 1 wherein a portion of said fine tuning mechanism is supported by said second lever.

4. In a television tuner of the type having a housing, a detented selector shaft rotation of which is effective to tune said tuner to one of a plurality of discrete frequencies, a fine tuning mechanism having a fine tuning element and a plurality of gears including a gear mounted for selectively engaging said fine tuning element, a fine tuning shaft coupled to said fine tuning mechanism for effecting fine tuning of said tuner via said fine tuning mechanism, and an automatic frequency control circuit, an automatic frequency control defeat mechanism comprising:

a switch affixed to said housing and electrically coupled to said automatic frequency control circuit, operation of said switch being effective to defeat the operation of said automatic frequency control circuit;

a lever arm forming part of said fine tuning mechanism having a first end pivotably attached to said housing and a second end rotatably supporting said fine tuning element engaging gear for relative movement with respect to said tuning element;

a cam affixed to said selector shaft for rotation therewith, said cam having a predetermined number of lobes corresponding to the number of detent positions of said selector shaft; and a lever pivotably attached to said tuner for engaging said cam and said switch, siad lever being operative to operate said switch for defeating the operation of said automatic frequency control circuit upon the rotation of said selector shaft between detent positions thereof, said lever being further engageable by said lever arm for operating said switch to defeat the operation of the automatic frequency control circuit upon the pivoting of said lever arm to bring said fine tuning element engaging gear into engagement with said fine tuning element.

5. An automatic frequency control defeat mechanism as recited in claim 4 wherein said lever arm and said lever are pivoted about a common point.

6. An automatic frequency control defeat mechanism as recited in claim 4 wherein a portion of said lever is interposed between said lever arm and said switch.

* * * * *